US012772548B2

(12) United States Patent
Jung

(10) Patent No.: US 12,772,548 B2
(45) Date of Patent: Oct. 20, 2026

(54) TRANSISTOR WITH INTERDIGIT ELECTRODES, COMPRISING A GATE TERMINAL CONNECTED BY A PLURALITY OF VERTICAL VIAS TO THE GATE ELECTRODES

(71) Applicant: STMicroelectronics France, Montrouge (FR)

(72) Inventor: Robin Jung, Toulouse (FR)

(73) Assignee: STMicroelectronics France, Montrouge (FR)

( * ) Notice: Subject to any disclaimer, the term of this patent is extended or adjusted under 35 U.S.C. 154(b) by 346 days.

(21) Appl. No.: 18/003,486

(22) PCT Filed: Jun. 15, 2021

(86) PCT No.: PCT/FR2021/051069
§ 371 (c)(1),
(2) Date: Dec. 27, 2022

(87) PCT Pub. No.: WO2022/003265
PCT Pub. Date: Jan. 6, 2022

(65) Prior Publication Data

US 2023/0253401 A1 Aug. 10, 2023

(30) Foreign Application Priority Data

Jun. 30, 2020 (FR) ....................................... 2006863

(51) Int. Cl.
*H10D 84/83* (2025.01)
*H10W 20/20* (2026.01)
(Continued)

(52) U.S. Cl.
CPC ............ *H10D 84/83* (2025.01); *H10W 20/20* (2026.01); *H10W 20/40* (2026.01); *H10W 20/42* (2026.01);
(Continued)

(58) Field of Classification Search
CPC ..... H10W 20/40; H10W 20/20; H10W 20/42; H10W 70/60; H10D 30/475;
(Continued)

(56) References Cited

U.S. PATENT DOCUMENTS 5,789,791 A * 8/1998 Bergemont .......... H10D 64/519 257/920
8,350,363 B2 * 1/2013 Chaabouni ........ H01L 21/76898 257/E21.597
(Continued)

FOREIGN PATENT DOCUMENTS

EP 2639829 A2 9/2013

*Primary Examiner* — Dale E Page
*Assistant Examiner* — Cristian A Tivarus
(74) *Attorney, Agent, or Firm* — Seed Intellectual Property Law Group LLP

(57) ABSTRACT

The invention concerns a field-effect transistor (100) having an interdigited structure and comprising:

- a plurality of elementary transistor cells (50) arranged in parallel, each elementary cell comprising a source electrode (1), a drain electrode (3), and a gate electrode (2) interposed between the source and drain electrodes,
- a source terminal (10) and a drain terminal (30) respectively connected to the source electrodes (1) and to the drain electrodes (3) of the elementary cells (50),
- a gate terminal (20) connected to the gate electrodes (2) of the elementary cells.

The field-effect transistor (100) only comprises vertical conductive vias to connect the gate electrodes to the gate terminal, and the gate terminal (20) is arranged vertically in line with all or part of the elementary cells (50).

11 Claims, 9 Drawing Sheets

(51) Int. Cl.

| | |
|---|---|
| ***H10W 20/40*** | (2026.01) |
| ***H10W 20/42*** | (2026.01) |
| ***H10W 70/60*** | (2026.01) |
| *H10W 72/30* | (2026.01) |
| *H10W 90/00* | (2026.01) |

(52) U.S. Cl.
CPC .......... *H10W 70/60* (2026.01); *H10W 72/352* (2026.01); *H10W 90/734* (2026.01)

(58) Field of Classification Search
CPC .... H10D 64/111; H10D 64/117; H10D 84/83; H10D 64/254; H10D 64/256; H10D 64/519; H10D 64/257; H01L 23/481; H01L 23/482; H01L 23/498; H01L 23/5226; H01L 24/29; H01L 24/32; H01L 2224/32227

See application file for complete search history.

(56) References Cited

U.S. PATENT DOCUMENTS

| | | | | |
|---|---|---|---|---|
| 10,103,233 | B1 | 10/2018 | Khalil et al. | |
| 10,867,851 | B2 * | 12/2020 | Lee | H01L 21/76879 |
| 2006/0202272 | A1 * | 9/2006 | Wu | H10D 64/112 257/E29.253 |
| 2011/0018058 | A1 * | 1/2011 | Disney | H10D 62/127 257/E29.26 |
| 2011/0186858 | A1 | 8/2011 | Roberts et al. | |
| 2013/0234207 | A1 * | 9/2013 | Choi | H10D 30/47 257/194 |
| 2014/0091366 | A1 * | 4/2014 | Jeon | H10D 88/101 257/195 |
| 2014/0239411 | A1 * | 8/2014 | Brech | H10D 64/256 438/667 |
| 2015/0243657 | A1 * | 8/2015 | Lin | H10D 30/4755 257/401 |
| 2015/0303164 | A1 * | 10/2015 | Chen | H01L 24/33 361/720 |
| 2015/0311330 | A1 * | 10/2015 | Li | H10D 30/015 438/172 |
| 2018/0248041 | A1 | 8/2018 | Hook et al. | |
| 2021/0098617 | A1 * | 4/2021 | Lin | H10D 30/475 |

* cited by examiner

TRANSISTOR WITH INTERDIGIT ELECTRODES, COMPRISING A GATE TERMINAL CONNECTED BY A PLURALITY OF VERTICAL VIAS TO THE GATE ELECTRODES

FIELD OF THE INVENTION

The present invention concerns the field of semiconductors and of microelectronic devices, particularly devices capable of reliably operating at radio frequencies and above, while being capable of managing high power loads.

It concerns in particular a field-effect transistor based on an interdigited electrode structure, defining a plurality of elementary transistor cells arranged in parallel, each elementary cell including a source electrode, a gate electrode, and a drain electrode, and the gate terminal of the transistor being connected to the gate electrodes of the elementary cells by a plurality of vertical vias.

TECHNOLOGICAL BACKGROUND OF THE INVENTION

A field-effect transistor 90 (FET) based on a lateral diffused metal-oxide-semiconductor technology (LD-MOS) generally has an interdigited electrode structure (FIG. 1a). Such a structure corresponds to the placing in parallel of a plurality of elementary transistor cells 50 (or elementary transistors), each comprising a source electrode 1, a drain electrode 3, and a gate electrode 2 interposed between the above-mentioned two. These electrodes 1, 2, 3 take the shape of elongated lines (or fingers), which extend on the active region 40 of transistor 90. Each elementary cell 50 has the same electric characteristics (such as in particular the threshold voltage (VTH), the drain-source breakdown voltage ($BV_{DSS}$), and the on-state resistance ($R_{DS(on)}$)) defined by the properties of the semiconductor substrate of active region 40 and of the electrodes 1, 2, 3 arranged thereon.

The source, gate, and drain electrodes 1, 2, and 3 are respectively connected to source, gate, and drain terminals 10, 20, and 30. In the example of FIG. 1a, a source terminal 10 and a drain terminal 30 extend at the periphery of active region 40 along an axis perpendicular to the axis of electrodes 1, 2, 3 and opposite to one another; they are directly connected to an end of the respective source and drain electrodes 1 and 3. Still in this example, two gate terminals 20 are arranged in the periphery of active region 40 and connected to the plurality of gate electrodes 2 of elementary cells 50 via a connection line 21 coupled to an end of said electrodes 2.

The resistance of connection line 21, which is linked to the resistivity of the material used and to the line length between each gate electrode 2 and a gate terminal 20, directly affects the switching delays of transistor 90. FIG. 1*b* qualitatively illustrates the increase of the switching delay with the distance between a gate electrode 2 and gate terminal 20.

In a LD-MOSFET transistor with an interdigited structure, this delay may induce a current focusing in the elementary cells 50 which are closest to gate terminals 20: indeed, at the switching to the on state of transistor 90, these elementary cells 50 are the first ones to switch and conduct a very high quantity of current for a short time interval, linked to the switching delay of the elementary cells 50 most distant from gate terminals 20. This high current, coupled to the strong electric field implied during the switching, generates a significant stress on elementary transistors 50, likely to deteriorate them.

To limit this problem, it is possible to form a plurality of independent gate terminals 20, each connecting part of the gate electrodes 2 of elementary cells 50: the length of connection line 21 may be decreased and the switching delay decreased. This type of solution however has the disadvantage of consuming a larger surface area of active region 40 to arrange the independent terminals, and thus of degrading the on-state resistance of transistor 90 ($R_{DS(on)}$).

OBJECT OF THE INVENTION

The present invention provides a solution overcoming all or part of the previously-mentioned disadvantages. It concerns in particular a field-effect transistor having an interdigited structure where a plurality of elementary transistor cells are arranged in parallel, each comprising a source electrode, a gate electrode, and a drain electrode; the gate electrodes are all connected to a gate terminal by vertical conductive vias, said gate terminal being arranged vertically in line with the elementary cells.

BRIEF DESCRIPTION OF THE INVENTION

The present invention concerns a field-effect transistor having an interdigited structure and comprising:

- a plurality of elementary transistor cells arranged in parallel, each elementary cell comprising a source electrode, a drain electrode, and a gate electrode interposed between the source and drain electrodes,
- a source terminal and a drain terminal respectively connected to the source electrodes and to the drain electrodes of the elementary cells,
- a gate terminal connected to the gate electrodes of the elementary cells.

The field-effect transistor is remarkable in that it only comprises vertical conductive vias to connect the gate electrodes to the gate terminal. A plurality of conductive vias distributed along each gate electrode couples each gate electrode to the gate terminal; and the gate terminal is arranged vertically in line with all or part of the elementary cells.

According to advantageous features of the invention, taken alone or according to any possible combination:

- the gate terminal is arranged on a front surface of the transistor, and conductive vias cross a dielectric layer interposed between the gate electrodes of the elementary cells and the gate terminal;
- the gate terminal is arranged on a rear surface of the transistor, and the conductive vias cross a semiconductor substrate of the transistor;
- the gate terminal is formed by a copper film bonded to a ceramic support, having the rear surface of the transistor assembled thereon via an electrically-conductive glue;
- the conductive vias are uniformly distributed along each gate electrode;
- each conductive via has a cross-section area, of circular, square, rectangular, or polygonal shape in the range from 1 to 100 square microns;
- the conductive vias comprise an electrically-conductive material selected from among copper and aluminum;
- the field-effect transistor comprises a semiconductor surface layer comprising a stack based on III-N material, in particular based on GaN and AlGaN material, wherein the conduction channel consists of a two-dimensional electron gas layer.

BRIEF DESCRIPTION OF THE DRAWINGS

Other features and advantages of the invention will appear from the following detailed description in relation with the appended drawings, in which.

The same reference numerals in the drawings may be used for elements of same nature.

The figures are simplified representations which, for readability purposes, are not to scale. In particular, the thicknesses of the layers along the z axis are not to scale with respect to the lateral dimensions along the y and z axes.

DETAILED DESCRIPTION OF THE INVENTION

The invention concerns a field-effect transistor (FET) 100 comprising a semiconductor substrate having at least one surface layer forming the active region of transistor 100. As well known, the active region defines a source region, a drain region, and a conduction channel between these two regions. The transistor is based on a LD-MOS technology, the source and drain regions are thus included in the surface layer and the conduction therebetween is performed laterally, in the main plane (x,y) of said layer.

The source and drain semiconductor regions are in ohmic contact with respective source and drain electrodes. A gate electrode is arranged between the source and drain electrodes, above the conduction channel of the active region. The voltage applied to the gate electrode enables to manage the on or off state of transistor 100.

Figure 1A:
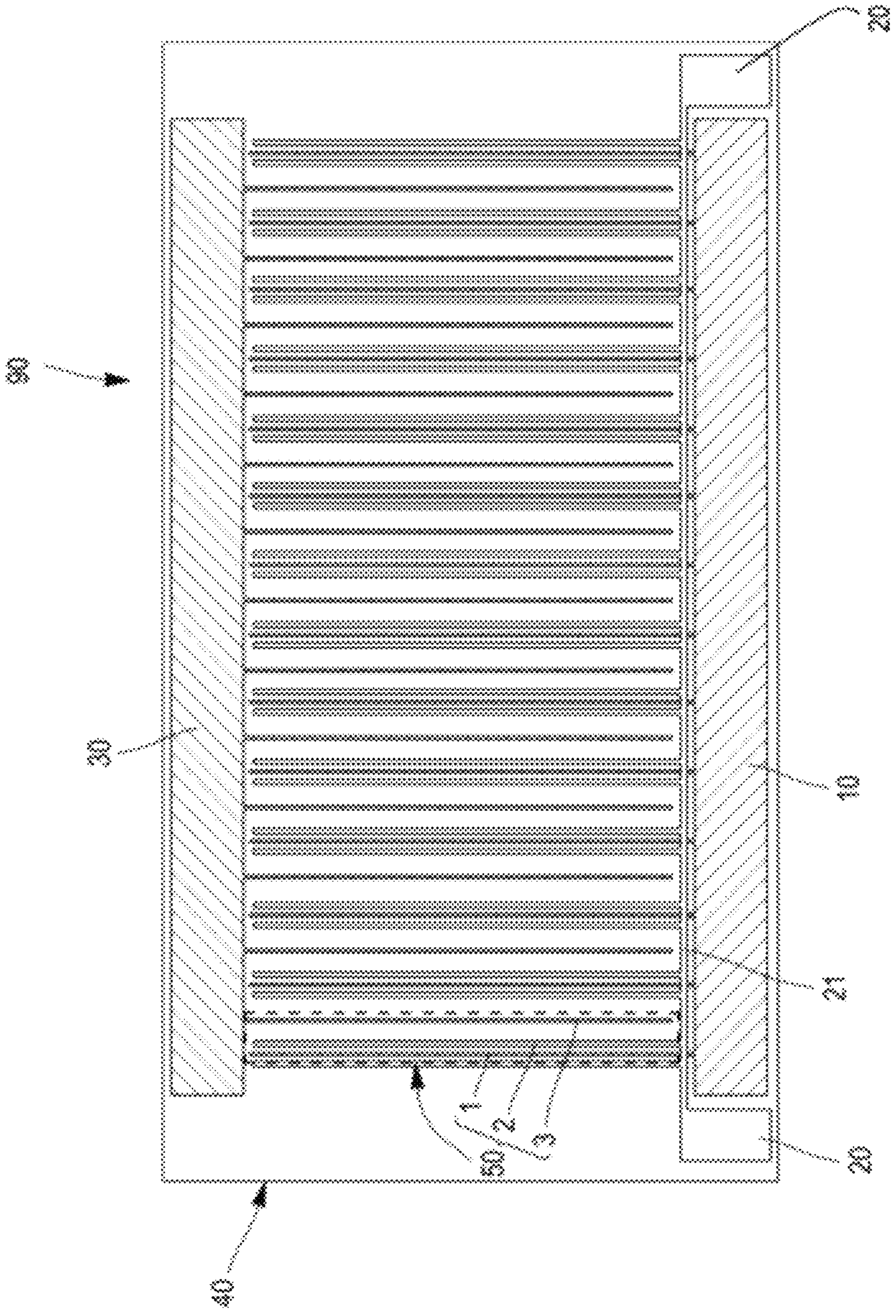
FIG. 1A PRIOR ART
FIGS. 1*a* and 1*b* show a transistor with an interdigited structure according to the state of the art.
Figure 1B:
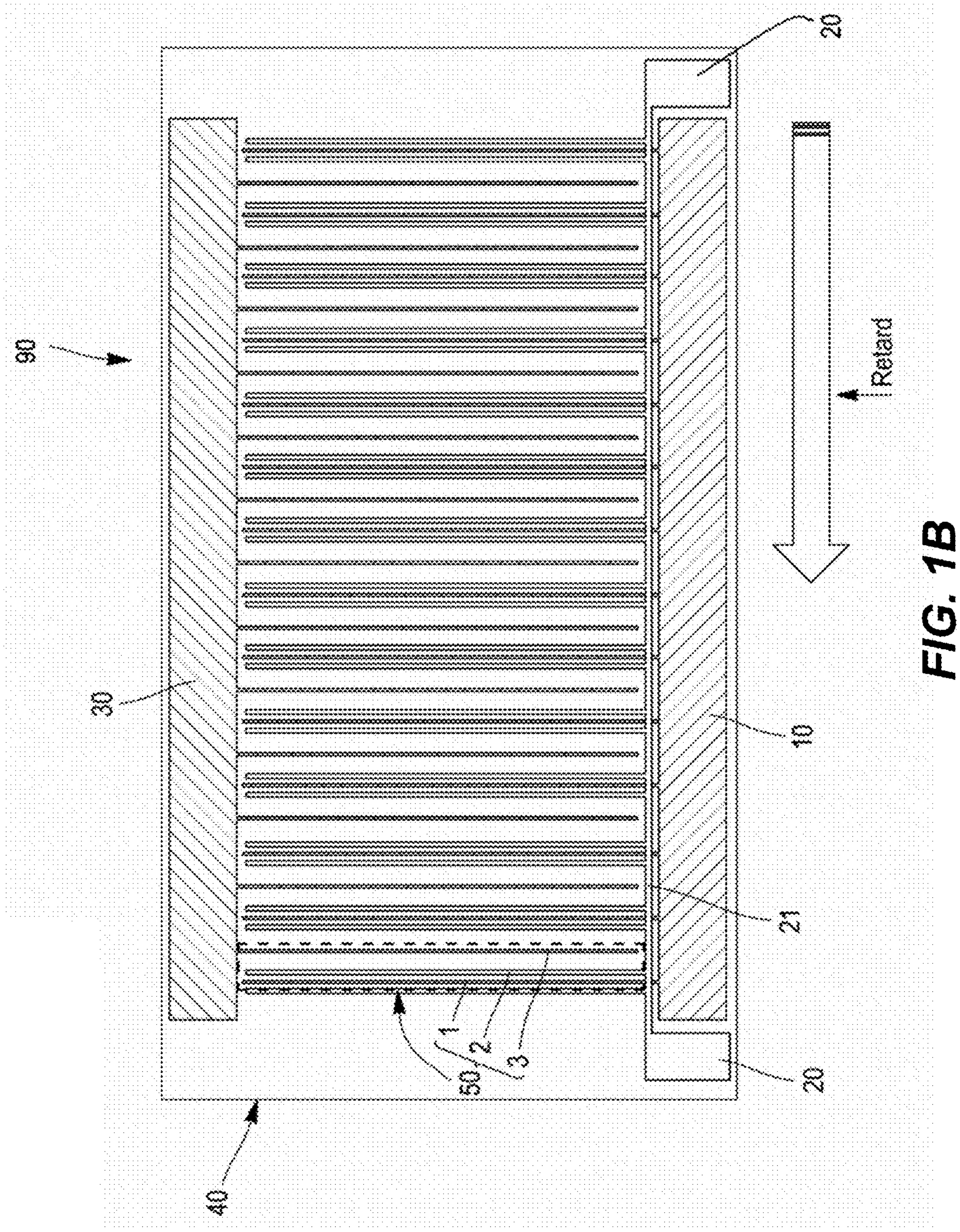
FIG. 1B PRIOR ART
Figure 2:
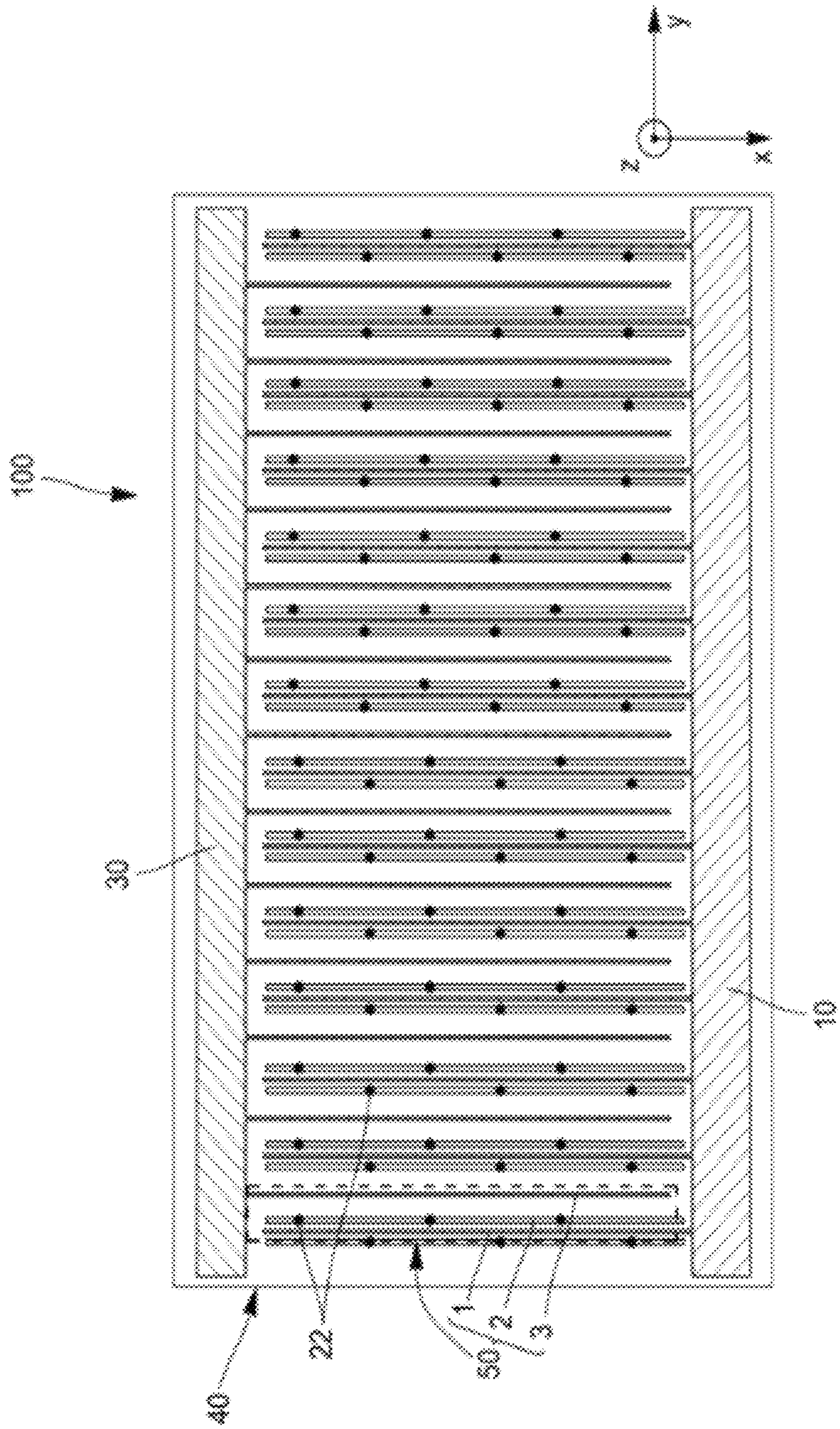
FIG. 2 shows a top view of a transistor according to the present invention.

The transistor 100 according to the invention has an interdigited electrode structure as apparent in top view in FIG. 2. It is formed by a plurality of elementary transistor cells 50 arranged in parallel in the main plane (x,y). Each elementary cell 50 comprises a source electrode 1, a drain electrode 3, and a gate electrode 2 interposed between source and drain electrodes 1 and 3.

Preferably, source, gate, and drain electrodes 1, 2, and 3 are made of aluminum. They typically have a length (along the x axis in the drawings) in the range from 1 mm to 2 mm and a width (along the y axis in the drawings) in the range from 1 to 10 microns.

All the source electrodes 1 of elementary cells 50 are electrically connected to the source terminal 10 of transistor 100. Drain electrodes 3 are electrically connected to the drain terminal 30 of transistor 100. As illustrated in FIG. 2, the source and drain terminals 10 and 30 advantageously extend at the periphery of active region 40, perpendicularly to the axis of electrodes 1, 3 and are electrically coupled to an end of the respective source and drain electrodes 1 and 3. Generally, terminals 10, 30 are arranged in a plane above the (x,y) plane having electrodes 1, 3 extending therein: vertical interconnects (that is, along the z axis in the drawings) between an end of source and drain electrodes 1 and 3 ensure their electric coupling respectively with source terminal 10 and drain terminal 30. These interconnects are not shown in the drawings.

Source and drain terminals 10 and 30 are typically made of the same material as electrodes 1, 3.

The transistor 100 according to the invention further comprises conductive vertical vias 22 to connect gate electrodes 2 to gate terminal 20. Gate terminal 20 is arranged vertically in line with all or part of elementary cells 50, that is, it is not in the same (x,y) plane as electrodes 1, 2, 3 and not necessarily in the same plane as source and drain terminals 10 and 30. Gate terminal 20 is, according to a first embodiment (FIGS. 3*a*, 3*b*), at the front surface of transistor 100, above electrodes 1, 2, 3 and separated therefrom by a dielectric layer 6. According to a second embodiment (FIGS. 5*a*, 5*b*), gate terminal 20 is arranged on the rear surface of transistor 100, below electrodes 1, 2, 3 and the semiconductor substrate 4 of said transistor 100.

According to one or the other of the embodiments, gate terminal 20 consumes no useful surface area of active region 40 since it is located vertically in line with all or part of elementary cells 50; it is not adjacent to elementary cells 20 50, conversely to source and drain terminals 10 and 30, which are located at the periphery of said cells 50 in the main (x,y) plane or in a higher plane. Such a configuration thus enables to optimize the surface area of active region 40.

Further, the arranging of gate terminal 20 on the front surface or on the rear surface of transistor 100 allows a greater degree of liberty as to the dimensions (lateral and thickness) of said terminal 20. The choice of a metallic material which is a very good electric conductor (for example, copper or aluminum) and of a wide surface area for gate terminal 20 enables to greatly decrease its resistance.

Conductive vias 22 are preferably made of a material which is a very good conductor, for example, copper. This also takes part in decreasing the gate resistance.

Preferably, each conductive via 22 has a cross-section area in the range from 1 to 100 square microns.

According to the invention, a plurality of conductive vias 22 couples each gate electrode 2 to gate terminal 20, as illustrated in FIG. 2. Each via 22 vertically connects a gate electrode 2 lengthwise, and not at an end or on an extension specifically provided for this purpose.

The plurality of conductive vias 22 directly connected between each gate electrode 2 and gate terminal 20 enables to significantly decrease the gate resistance.

As an example, for gate electrodes 2 having a length (along the x axis) in the order of 1 mm, between four and eight conductive vias 22, distributed all along the length, may be formed. In particular, in the second embodiment, the number of vias 22 per gate electrode 2 is defined by the tradeoff between the gate inrush current density and the active surface area encroached upon by the crossing of vias 22.

Figure 3A:
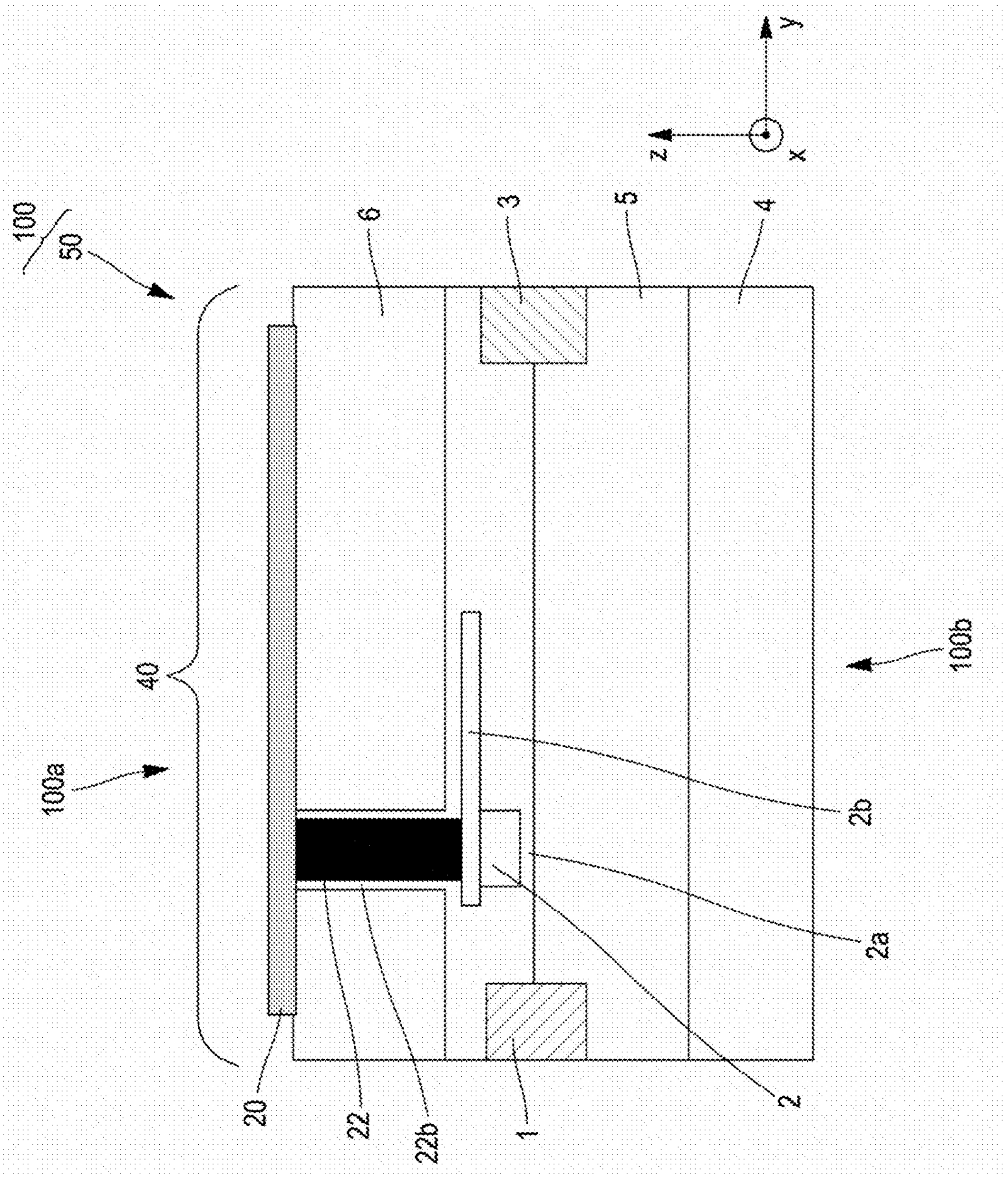
FIGS. 3*a* and 3*b* respectively show a cross-section view of an elementary cell of a transistor, and a top view of said transistor according to a first embodiment of the invention.

Returning to the description of the first embodiment of the invention, gate terminal 20 is thus arranged on the front surface 100*a* of transistor 100, that is, that at the level of which semiconductor surface layer 5 and active region 40 can be found. FIG. 3*a* illustrates a cross-section view of an elementary cell 50 of transistor 100 according to the invention. The semiconductor substrate comprises surface layer 5 and a lower support portion 4 (called support substrate 4 hereafter). Source and drain electrodes 1 and 3 are in ohmic contact with surface layer 5. The conduction channel (not shown) extends between the source and the drain, in the (x,y) plane.

Advantageously, semiconductor surface layer 5 comprises a stack based on III-N materials, in particular based on GaN, AlGaN, AlN, etc. material. The conduction channel then consists of a two-dimensional electron gas (2DEG) layer, and source and drain electrodes 1 and 3 are in ohmic contact with said 2DEG layer. Transistor 100 then is a power transistor, adapted to high-voltage applications.

In the example of FIG. 3*a*, a gate oxide 2*a* separates gate electrode 2 and surface layer 5. Gate oxide 2*a* is typically made of silicon oxide and has a thickness of a few tens of nanometers.

Advantageously, gate electrode 2 is connected to a field plate 2*b*, separated from surface layer 5 by an insulating layer having a thickness greater than or equal to the thickness of gate oxide 2*a*.

Electrodes 1, 2, 3 are covered with a dielectric layer 6, at least partly formed by a so-called passivation layer.

Dielectric layer 6 preferably comprises silicon oxide, silicon nitride, or also alumina.

Conductive vias 22 cross dielectric layer 6 to reach gate electrode 2. A conventional method implying steps of lithography, of etching of dielectric layer 6, and then of deposition for the filling of vias 22, may be implemented. An insulating and/or diffusion barrier forming film 22*b* may be deposited on the walls of the trench corresponding to each via 22, before its filling with an electrically-conductive material.

Figure 3B:
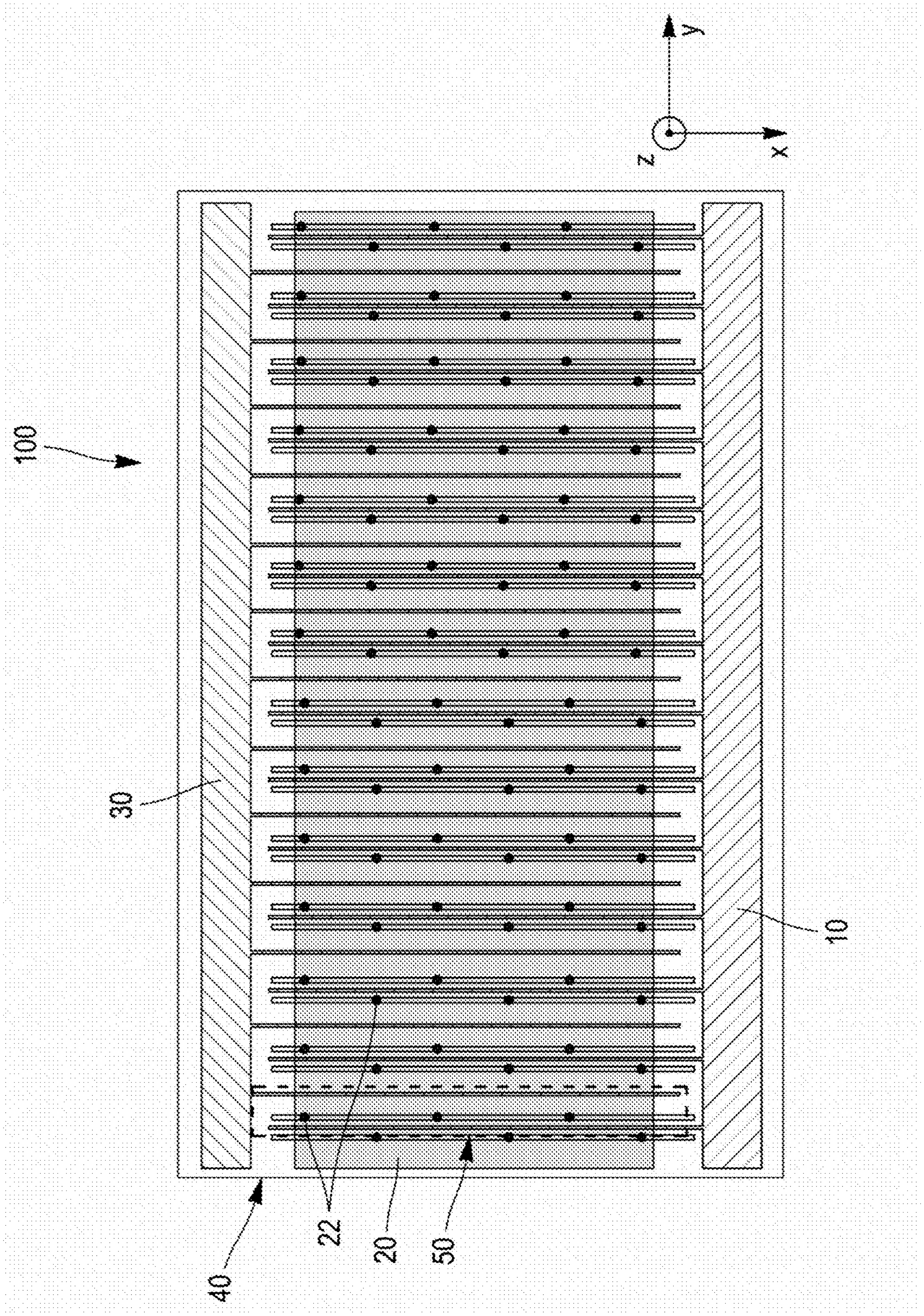

Gate terminal 20 is then formed by deposition of a conductive metallic material on dielectric layer 6, in electric contact with vias 22. Gate terminal 20 is arranged above all or part of the active region 40 of elementary cell 50, and more generally above all or part of the active region 40 of transistor 100, as illustrated in FIG. 3*b*.

Contacts 200, to connect transistor 100 to another electronic device or to a package, may be formed either by wire contact or via pads or balls implemented in known packaging techniques.

Figure 4:
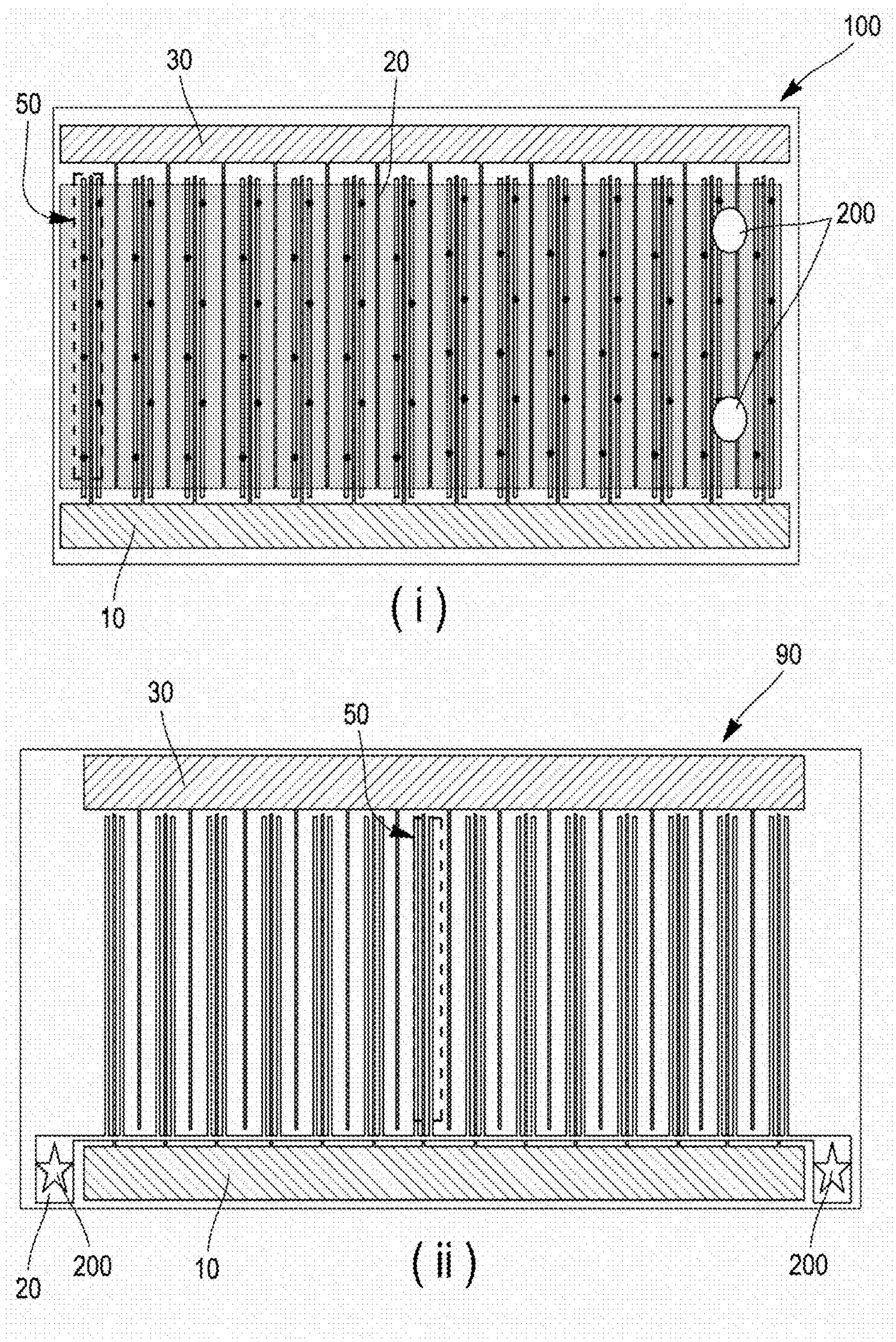
FIG. 4 shows a transistor according to the first embodiment of the invention (i), compared with a transistor with an interdigited structure according to the state of the art (ii), and indicate the location, on each transistor, of the elementary cell for which resistance $R_G$, between its gate electrode and a pad contacting the gate terminal, has been estimated.

A comparison has been made between a transistor 100 according to the first implementation mode of the invention and a transistor 90 of the state of the art, respectively referenced as (i) and (ii) in FIG. 4. The calculation of gate resistance RG is performed for the least favorable area of the transistor, that is, for the elementary cell 50 most distant from contacting pads 200.

In the example (i) of transistor 100 according to the invention, the calculation of $R_G$ is performed between the gate electrode 2 of leftmost elementary cell 50 in FIG. 4 and two contact pads 200 located to the right on transistor 100; contact pads 200 are balls deposited on gate terminal 20. The latter is formed by a copper layer having a 10-micron thickness with a resistance of approximately 5 mohms. Conductive vias 22 have a square cross-section with an 8-micron side length in the (x,y) plane and extend along a 50-micron height (along the z axis), between gate electrodes 2 and gate terminal 20. Dielectric layer 6 thus has a thickness in the order of 50 microns. Conductive vias 22 are made of copper. The associated resistance is approximately 13 mohms. One thus estimates to approximately 18 mohms the gate resistance $R_G$ between the gate electrode 2 of the considered elementary cell 50 and contact pad 22.

Still referring to FIG. 4, in the example (ii) of a transistor of the state of the art, the calculation of $R_G$ is performed between the gate electrode 2 of a central elementary cell 50 and two contact pads 200 formed by wire connections connected to the gate terminal 20 located at the periphery of the active region 40 of transistor 90; it should be reminded that each gate electrode 2 of elementary cells 50 is coupled to gate terminals 20 via a connection line 21. The gate structure (gate electrodes 2, connection line 21, and gate terminals 20) is elaborated on two metal levels and tungsten interconnects connect these two levels, as conventionally achieved. The gate resistance $R_G$ between the gate electrode 2 of the considered elementary cell 50 and contact pad 200 then is in the order of from 2 to 3 ohms.

The transistor 100 according to the invention thus provides a sharp decrease by approximately a factor 100 of gate resistance $R_G$, greatly limiting the issue of current focusing in certain elementary cells at the switching to the on state of the transistor.

According to a second embodiment of the invention, gate terminal 20 is arranged on the rear surface of transistor 100, below electrodes 1, 2, 3 and the semiconductor substrate of said transistor 100.

Figure 5A:
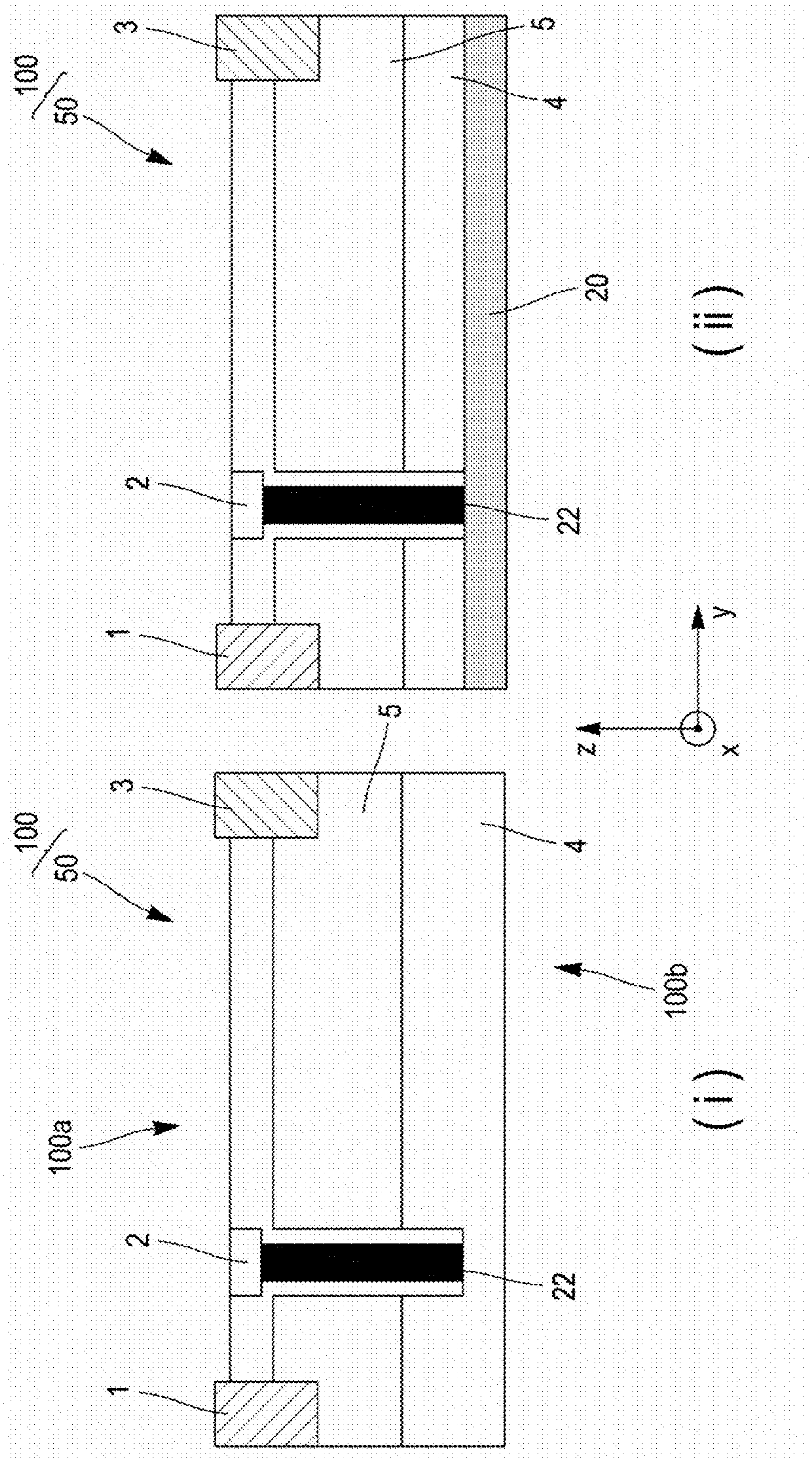
FIGS. 5*a* and 5*b* respectively show a cross-section view of an elementary cell of a transistor, and a top view of said transistor according to a second embodiment of the invention.

FIG. 5*a* illustrates a cross-section view of an elementary cell 50 of the transistor 100 according to the invention. It shows the semiconductor substrate, comprising surface layer 5 and support substrate 4. Source and drain electrodes 1 and 3 are in ohmic contact with surface layer 5. The conduction channel (not shown) extends between the source and the drain, in the (x,y) plane.

As in the first embodiment, semiconductor surface layer 5 advantageously comprises a stack based on III-N materials, in particular based on GaN, AlGaN, AlN, etc. material. The conduction channel then consists of a two-dimensional electron gas (2DEG) layer, and source and drain electrodes 1 and 3 are in ohmic contact with said 2DEG layer.

A gate oxide separates gate electrode 2 and surface layer 5. The gate oxide is typically made of silicon oxide and has a thickness of a few tens of nanometers. Gate electrode 2 may be connected to a field plate, separated from surface layer 5 by an insulating layer having a thickness greater than or equal to the thickness of the gate oxide.

Conductive vias 22 may be elaborated according to two variants: the first variant provides the forming of vias 22 by etching and deposition from the front surface of the semiconductor substrate of transistor 100; the second variant provides the forming of vias 22 from its rear surface.

According to the first variant, vias 22 are formed prior to the forming of gate electrodes 2. A method of photolithography and drive-in (for example, by reactive ion etching—RIE) through surface layer 5 and through all or part of support substrate 4, first enables to form trenches from front surface 100*a*. An insulating film is deposited on the walls of the trenches, to insulate conductive vias 22 from the semiconductor materials of surface layer 5 and of support substrate 4. A metal deposition is then performed to fill the trenches and form vias 22. Gate electrodes 2 may then be elaborated; it should be noted that source and drain electrodes 1 and 3 may be formed before or after all or part of the elaboration of vias 22.

In the specific case where it is provided to thin support substrate 4 at the end of the manufacturing of transistor 100, it is advantageous not to have conductive vias 22 emerge from support substrate 4 during their forming (FIG. 5*a* (i)); they will emerge at the end of the thinning of support substrate 4.

According to the second variant, conductive vias 22 are elaborated after the forming of electrodes 1, 2, 3 or even after the forming of source 10 and drain terminals 10 and 30. A method implying steps of photolithography and drive-in (for example, by reactive ion etching—RIE) through support substrate 4 and through surface layer 5, first enables to form trenches, from rear surface 100*b* to gate electrode 2. An insulating film is deposited on the trench walls, to insulate conductive vias 22 from the crossed semiconductor materials. A metal deposition is then performed to fill the trenches and form vias 22.

In one and the other of the previously-mentioned variants, gate terminal 20 is formed in contact with conductive vias 22 emerging at the level of the rear surface 100*b* of transistor 100 (FIG. 5*a* (ii)).

Figure 5B:
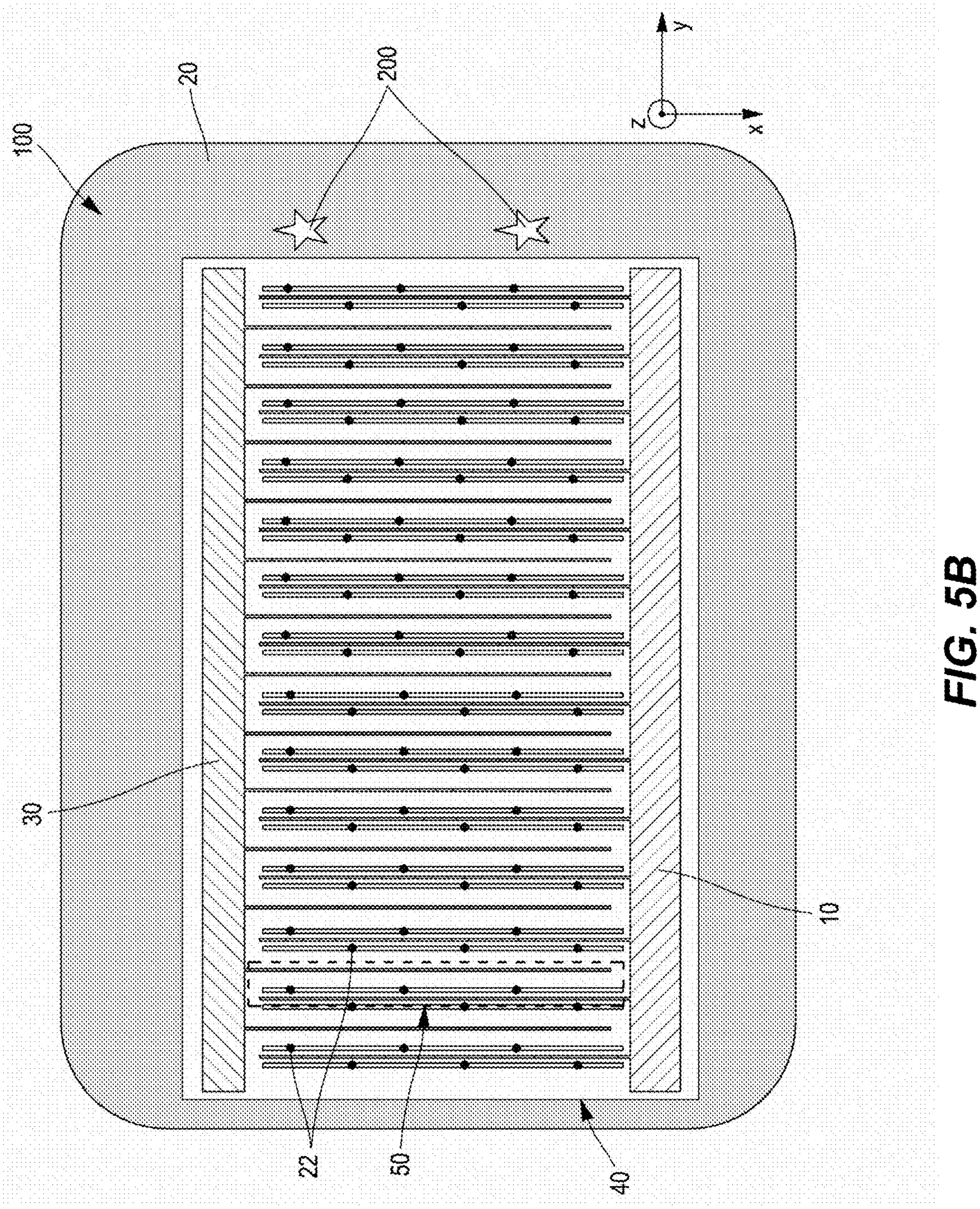

It may be elaborated by deposition of a conductive metallic material on support substrate 4. Gate terminal 20 may also be formed by a copper film bonded to a ceramic support (DBC for "direct bond copper") having the rear surface 100*b* of transistor 100 assembled thereon via an electrically-conductive glue (FIG. 5*b*).

This configuration provides the additional advantage of biasing support substrate 4 to the gate potential, that is, to a potential very close to that of the source. This biasing is generally useful for the proper operation of transistor 100 and is authorized with no additional step by the second embodiment of the invention.

Whatever the implemented alternative embodiment, gate terminal 20 is arranged under all or part of the active region 40 of elementary cell 50, and more generally under all or part of the active region 40 of transistor 100.

The contacts, to connect transistor 100 to another electronic device or to a package, may be formed either by wire contact or via pads or balls.

Figure 6:
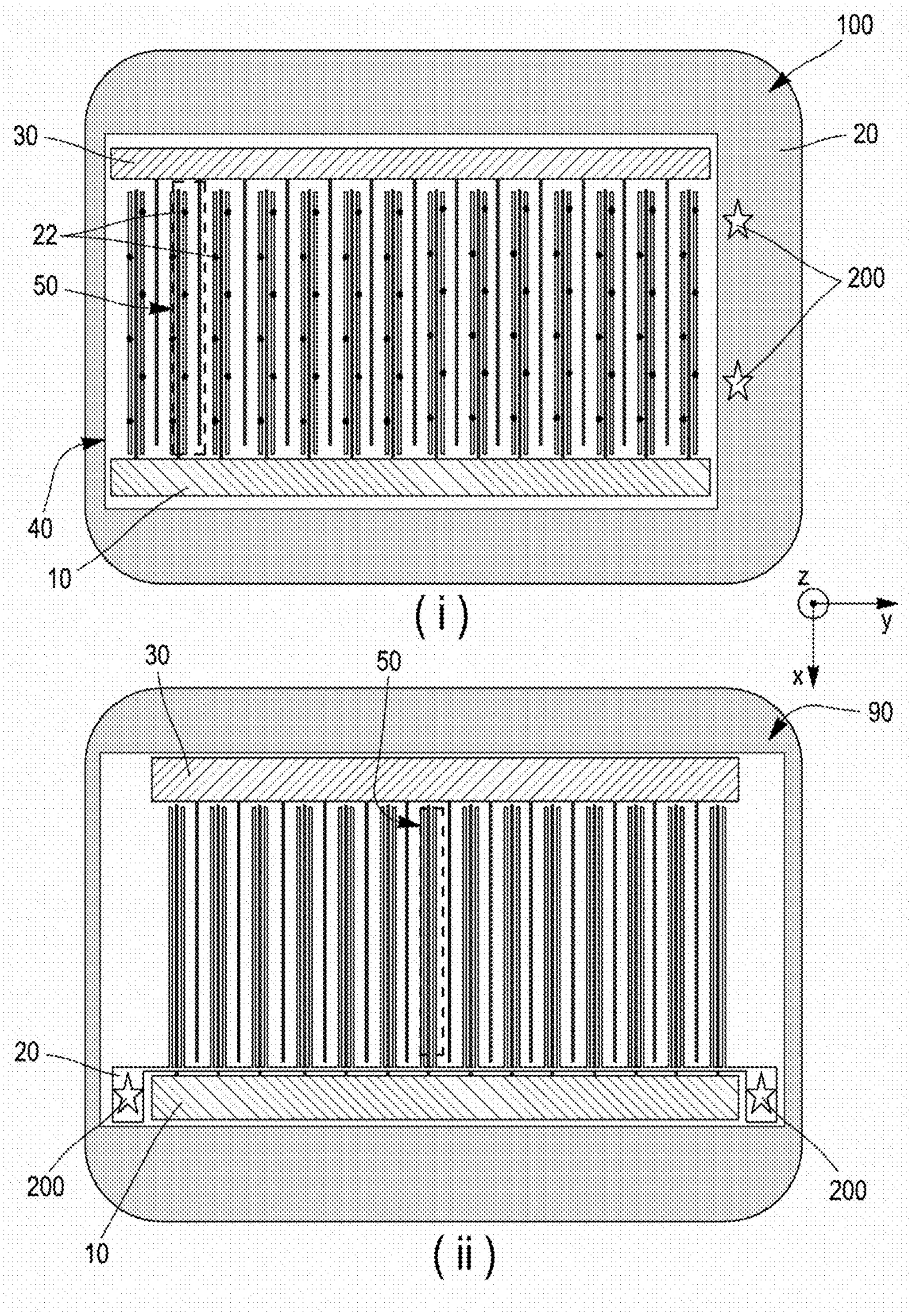
FIG. 6 shows a transistor according to the second embodiment of the invention (i), compared with a transistor having an interdigited structure according to the state of the art (ii), and indicates the location, on each transistor, of the elementary cell for which resistance $R_G$, between its gate electrode and a pad contacting the gate terminal, has been estimated.

A comparison has been made between a transistor 100 according to the second implementation mode of the invention (FIG. 6 (i)) and the transistor 90 of the state of the art (FIG. 6 (ii) already described in reference to the first embodiment. In the example (i) of transistor 100 according to the invention, the resistance RG, between the gate electrode 2 of the leftmost elementary cell 50 of transistor 100 and two contact pads 200 located on the right-hand side of transistor 100, is estimated; contact pads 200 are here wire connections fastened to the copper film (gate terminal 20 in electric contact with conductive vias 22) of a DBC. The copper film has a 90-micron thickness. The resistance associated with gate terminal 20 and with the wire connections is approximately 0.7 mohms.

A layer of conductive glue, for example, a glue based on silver with a resistivity ρ=6e-6 Ω.cm, ensures the assembly between the copper film of the DBC and the rear surface of transistor 100. The associated resistance is in the order of 14 mohms.

Conductive vias 22 have a square cross-section with an 8-micron side length in the (x,y) plane and extend along a 300-micron height (along the z axis), between gate electrode 2 and the rear surface 100*b* of support substrate 4. Conductive vias 22 are made of copper. The associated resistance is approximately 80 mohms. One thus estimates to approximately 95 mohms the gate resistance $R_G$ between the gate electrode 2 of the considered elementary cell 50 and contact pad 22.

As compared with the transistor 90 of the state of the art ($R_G$ in the order of from 2 to 3 ohms), the transistor 100 according to the second embodiment of the invention provides a gate resistance $R_G$ smaller by an order 10, and capable of reducing the issue of current focusing in certain elementary cells at the switching to the on state of the transistor.

Of course, the invention is not limited to the described embodiments and alternative embodiments may be brought thereto without departing from the framework of the invention such as defined by the claims.

The invention claimed is:

1. A field-effect transistor having an interdigited structure, the field-effect transistor comprising:

- a plurality of elementary transistor cells arranged in parallel, each elementary transistor cell of the plurality of elementary transistor cells including:
  - a source electrode;
  - a drain electrode;
  - a gate electrode between the source and drain electrodes; and
  - a field plate on the gate electrode;
- a source terminal;
- a drain terminal, the source terminal and drain terminal being respectively coupled to the source and drain electrodes of each elementary transistor cell;
- a dielectric layer on the source electrode, drain electrode, the gate electrode, and the field plate of each elementary transistor cell;
- a gate terminal coupled to the gate electrode of each elementary transistor and on the dielectric layer; and
- a plurality of conductive vias distributed along each gate electrode and extending through the dielectric layer,
- each respective gate electrode being coupled to the gate terminal by a respective set of conductive vias of the plurality of conductive vias and a respective field plate, and being vertically in line with the respective set of conductive vias and the respective field plate,
- the respective set of conductive vias including multiple conductive vias that are horizontally aligned with each other along the respective gate electrode and that are each directly contacting the gate terminal and the respective field plate,
- the gate terminal being vertically in line with the plurality of conductive vias, the source electrodes, the drain electrodes, and the gate electrodes of the plurality of elementary transistor cells, and
- the gate terminal being spaced from the gate electrodes of the plurality of elementary transistor cells by the plurality of conductive vias, and spaced from the source electrodes and the drain electrodes of the plurality of elementary transistor cells by the dielectric layer.

2. The field-effect transistor according to claim 1, wherein:

the gate terminal is on a front surface of the transistor.

3. The field-effect transistor according to claim 1, wherein the respective set of conductive vias are uniformly distributed along the respective gate electrode.

4. The field-effect transistor according to claim 1, wherein each conductive via of the plurality of conductive vias has a cross-section area of circular, square, rectangular, or polygonal shape, in the range from 1 to 100 square microns.

5. The field-effect transistor according to claim 1, wherein the plurality of conductive vias include an electrically-conductive material selected from copper and aluminum.

6. The field-effect transistor according to claim 1, further including a semiconductor surface layer having a stack based on III-N materials, particularly based on GaN and AlGaN material, wherein a conduction channel includes a two-dimensional electrode gas layer.

7. A device, comprising:

a substrate having a first surface, the first surface including an active region of a transistor;

a first transistor cell and a second transistor cell adjacent to each other on the substrate, each one of the first and second transistor cells having a source electrode, drain electrode, gate electrode, and a field plate;

a source terminal at a first end of the active region, the source terminal being coupled to the source electrodes;

a drain terminal opposite the source terminal, the drain terminal being coupled to the drain electrodes;

a first dielectric layer on the source terminal, on the drain terminal, and on the gate electrodes;

a gate terminal being spaced from the gate electrodes by the first dielectric layer; and a plurality of conductive vias through the first dielectric layer extending toward the first surface, the plurality of conductive vias and the field plates vertically in line with and coupled between the gate electrodes and the gate terminal, the gate terminal being spaced from the gate electrodes of the first transistor cell and the second transistor cell by the plurality of conductive vias and the field plates, the gate terminal being vertically in line with the plurality of conductive vias, the source electrodes, the drain electrodes, the gate electrodes, and the field plates of the first transistor cell and the second transistor cell, each respective gate electrode being coupled to the gate terminal by a respective set of conductive vias of the plurality of conductive vias and a respective field plate, and being vertically in line with the respective set of conductive vias and the respective field plate, and the respective set of conductive vias including multiple conductive vias that are horizontally aligned with each other along the respective gate electrode and that are each directly contacting the gate terminal and the respective field plate.

8. The device according to claim 7, wherein the gate terminal is in the active region of the transistor and spaced from the source, drain, and gate electrodes.

9. The device according to claim 7, wherein the gate electrode is between the source electrode and drain electrode.

10. The device according to claim 7, further including gate oxide surrounding the gate electrode and the field plate.

11. The device according to claim 7, further including a film between the first dielectric layer and the plurality of conductive vias.

* * * * *